(12) United States Patent
Wu et al.

(10) Patent No.: US 7,968,982 B2
(45) Date of Patent: Jun. 28, 2011

(54) THERMAL ENHANCED UPPER AND DUAL HEAT SINK EXPOSED MOLDED LEADLESS PACKAGE

(75) Inventors: Chung-Lin Wu, San Jose, CA (US); Rajeev D. Joshi, Cupertino, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 135 days.

(21) Appl. No.: 12/170,523

(22) Filed: Jul. 10, 2008

(65) Prior Publication Data

US 2009/0072362 A1    Mar. 19, 2009

Related U.S. Application Data

(63) Continuation of application No. 11/299,270, filed on Dec. 9, 2005, now Pat. No. 7,468,548.

(51) Int. Cl.
*H01L 23/495* (2006.01)
*H01L 23/10* (2006.01)
*H01L 23/34* (2006.01)
*H01L 23/28* (2006.01)

(52) U.S. Cl. ........ 257/675; 257/706; 257/707; 257/720; 257/796

(58) Field of Classification Search .................. 257/675, 257/676, 706, 718, 720, 796
See application file for complete search history.

(56) References Cited

U.S. PATENT DOCUMENTS

| | | | | |
|---|---|---|---|---|
| 5,378,924 A * | 1/1995 | Liang | ............................. | 257/675 |
| 5,629,561 A * | 5/1997 | Shin et al. | ..................... | 257/712 |
| 5,977,626 A * | 11/1999 | Wang et al. | .................... | 257/707 |
| 6,376,908 B1* | 4/2002 | Gaku et al. | ..................... | 257/707 |
| 6,400,014 B1* | 6/2002 | Huang et al. | .................. | 257/712 |
| 6,949,413 B2* | 9/2005 | Lo et al. | ........................ | 438/122 |
| 6,967,126 B2* | 11/2005 | Lee et al. | ...................... | 438/122 |
| 6,969,640 B1* | 11/2005 | Dimaano Jr. et al. | ......... | 438/122 |
| 7,126,218 B1* | 10/2006 | Darveaux et al. | ............. | 257/706 |
| 7,196,415 B2* | 3/2007 | Zhong et al. | ................. | 257/712 |
| 7,342,304 B2* | 3/2008 | Huang | ........................... | 257/706 |
| 2003/0057545 A1* | 3/2003 | Shim et al. | .................... | 257/706 |
| 2004/0217467 A1* | 11/2004 | Rumer et al. | ................. | 257/718 |

* cited by examiner

*Primary Examiner* — Teresa M Arroyo
(74) *Attorney, Agent, or Firm* — Jason R. Womer, Esq.; Thomas R. FitzGerald, Esq.; Hiscock & Barclay, LLP

(57) ABSTRACT

A semiconductor package includes a semiconductor device 30 and a molded upper heat sink 10. The heat sink has an interior surface 16 that faces the semiconductor device and an exterior surface 15 that is at least partially exposed to the ambient environment of the packaged device. An annular planar base 11 surrounds a raised or protruding central region 12. That region is supported above the plane of the base 11 by four sloped walls 13.1-13.4. The walls slope at an acute angle with respect to the planar annular base and incline toward the center of the upper heat sink 10. Around the outer perimeter of the annular base 11 are four support arms 18.1-18.4. The support arms are disposed at an obtuse angle with respect to the interior surface 16 of the planar annular base 11.

16 Claims, 9 Drawing Sheets

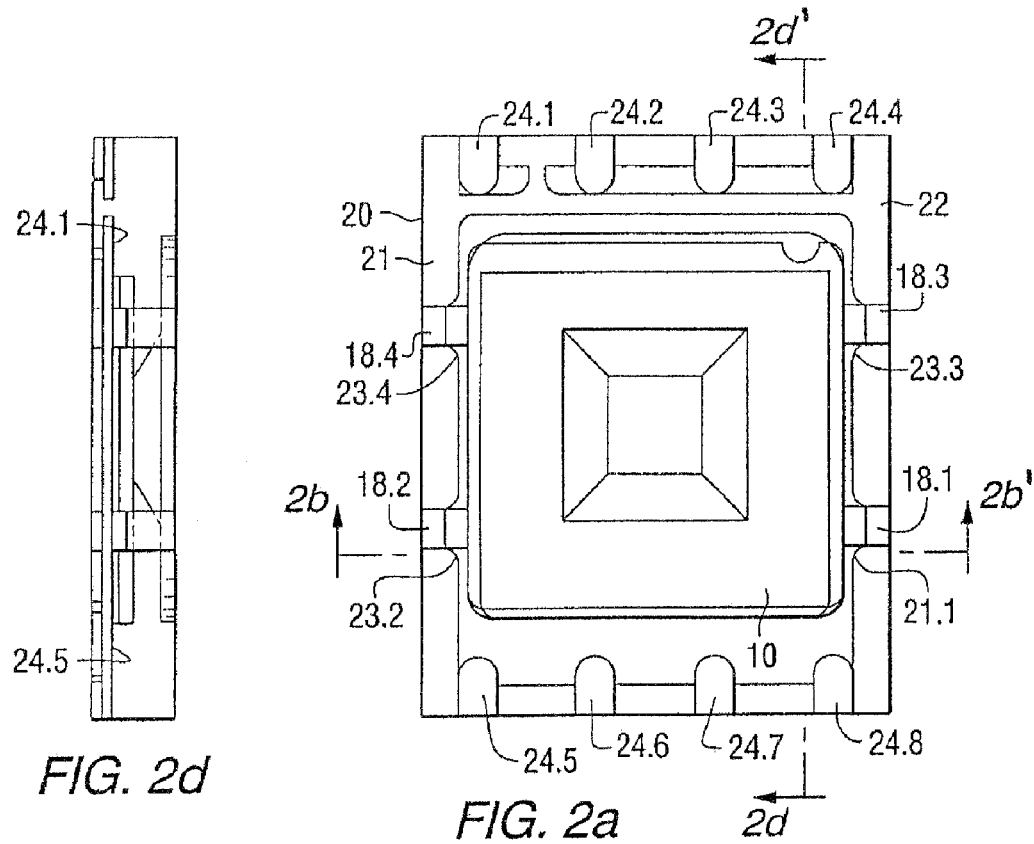
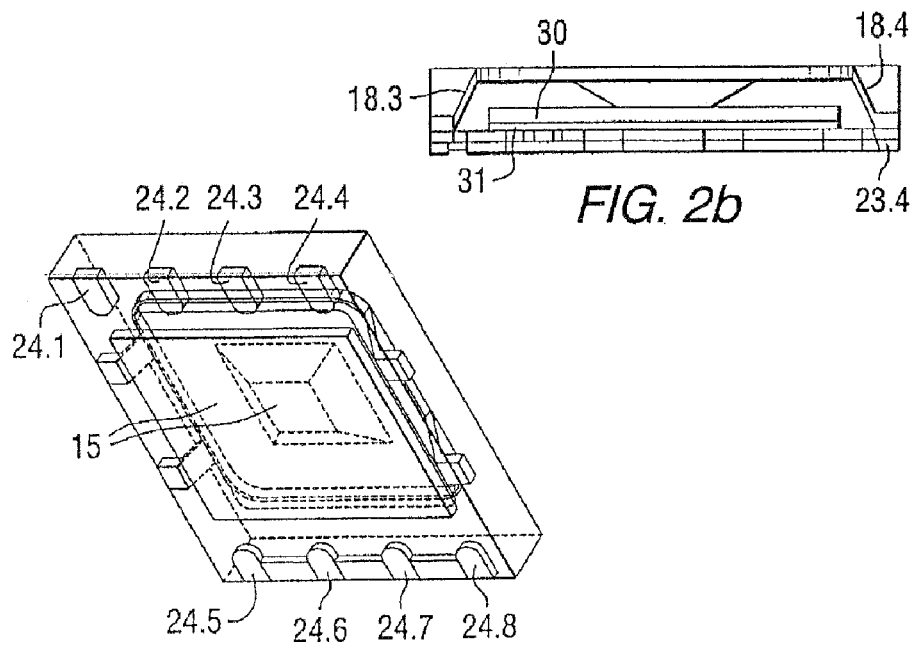

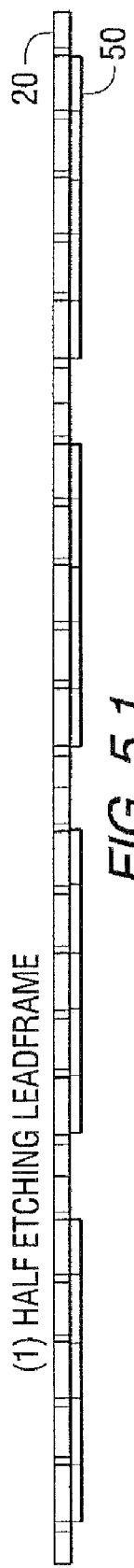
FIG. 5.1
(1) HALF ETCHING LEADFRAME
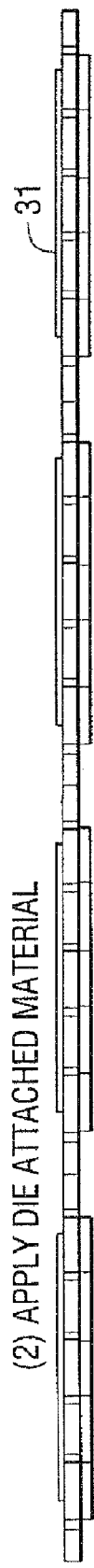
FIG. 5.2
(2) APPLY DIE ATTACHED MATERIAL
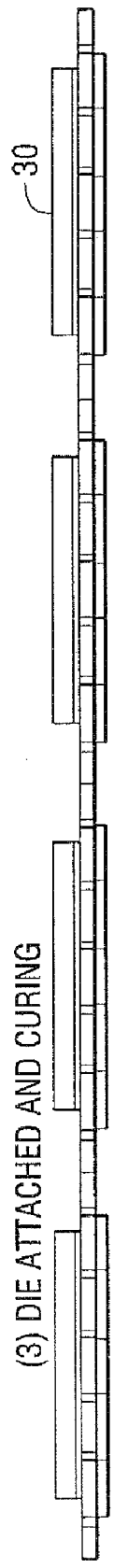
FIG. 5.3
(3) DIE ATTACHED AND CURING
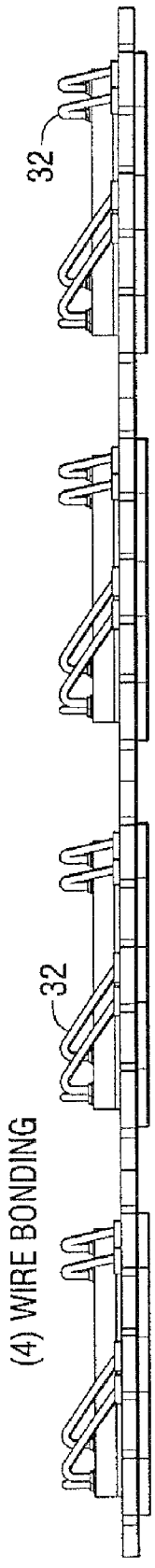
FIG. 5.4
(4) WIRE BONDING

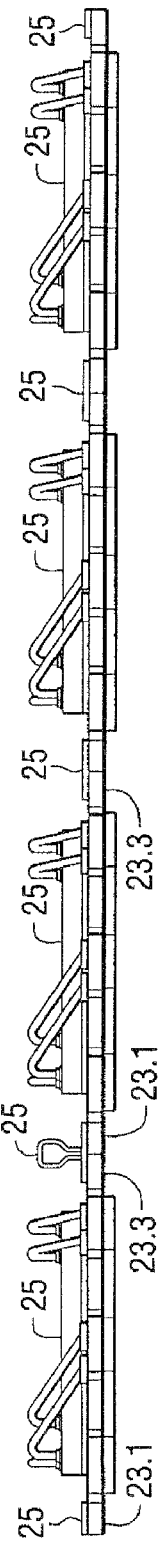
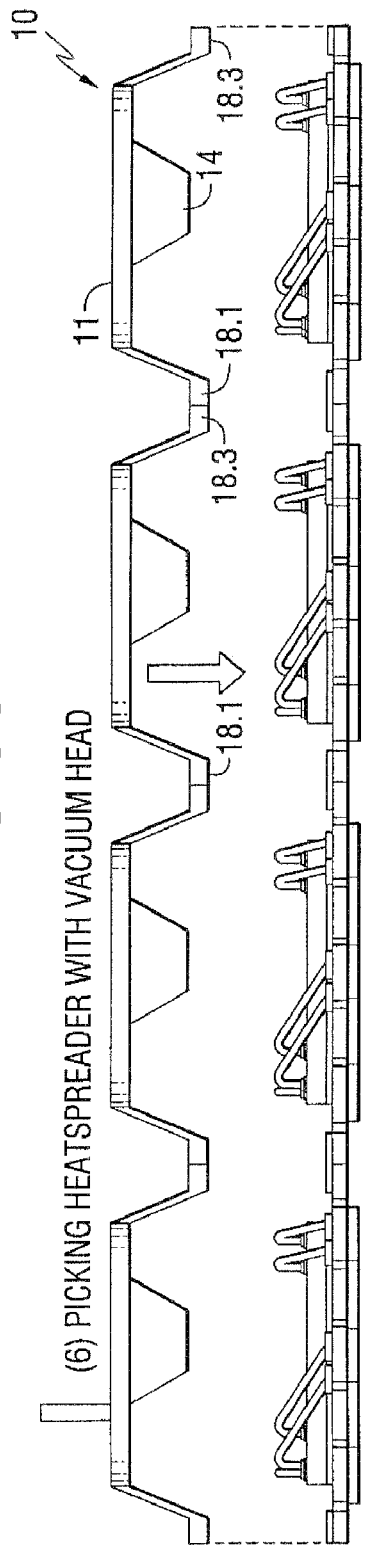
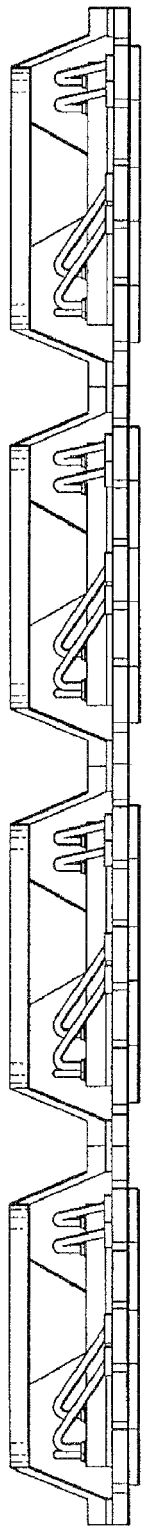
FIG. 5.5 (5) DISPENSE DIE ATTACHED MATERIAL - EITHER CONDUCTOR OR NONCONDUCTOR
FIG. 5.6 (6) PICKING HEATSPREADER WITH VACUUM HEAD
FIG. 5.7 (7) HEATSPREADER IS BONDED TO TIEBAR OF LEADFRAME

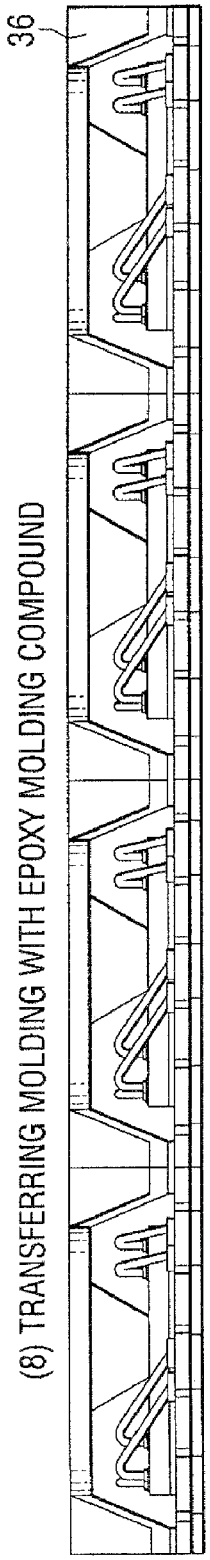
FIG. 5.8
(8) TRANSFERRING MOLDING WITH EPOXY MOLDING COMPOUND
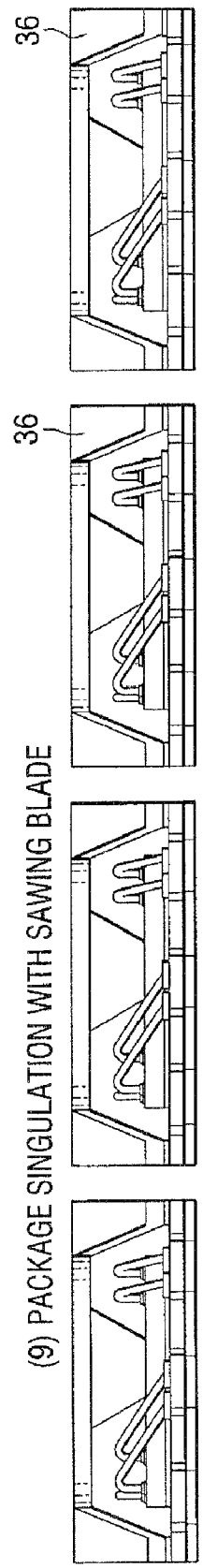
FIG. 5.9
(9) PACKAGE SINGULATION WITH SAWING BLADE

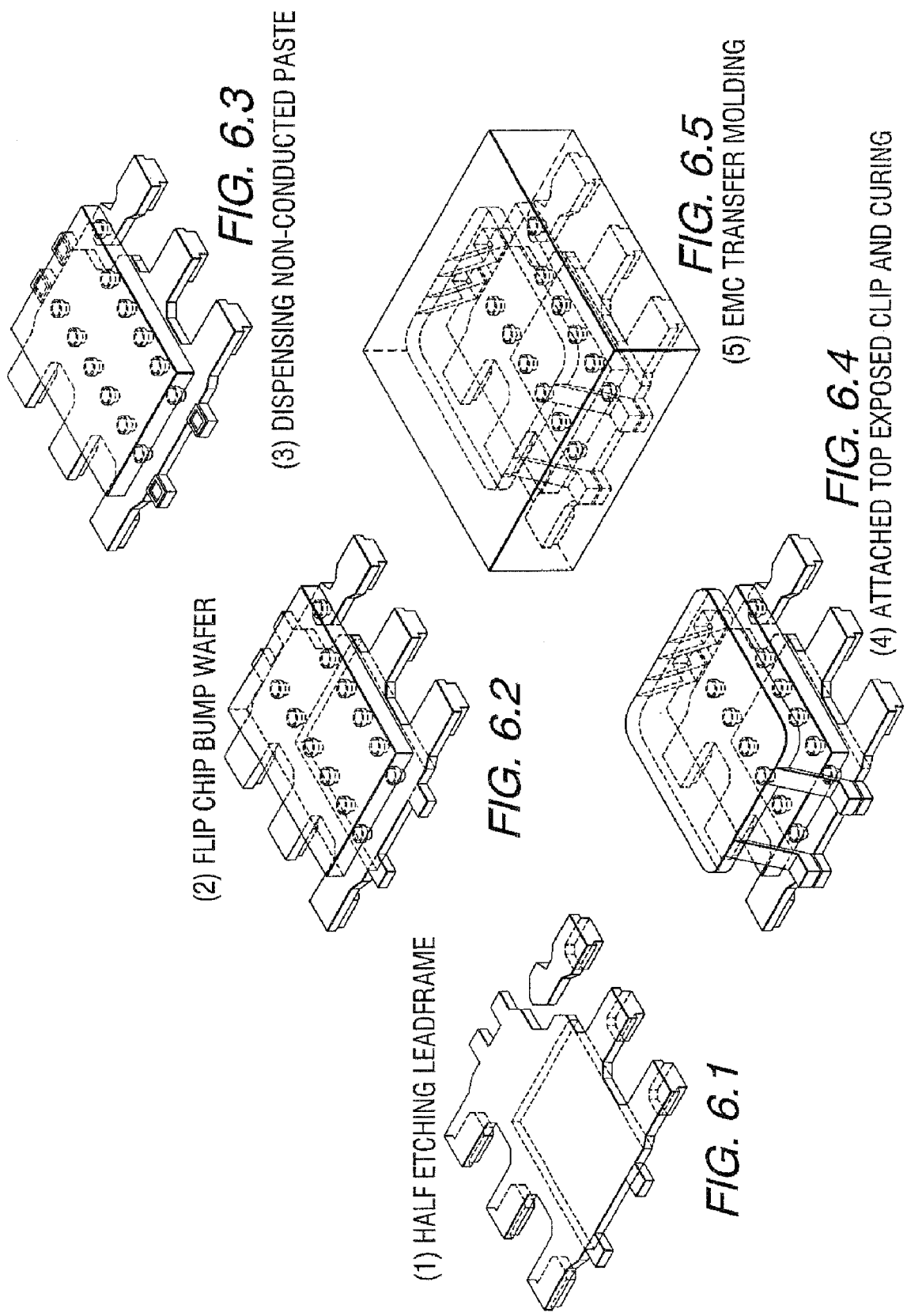

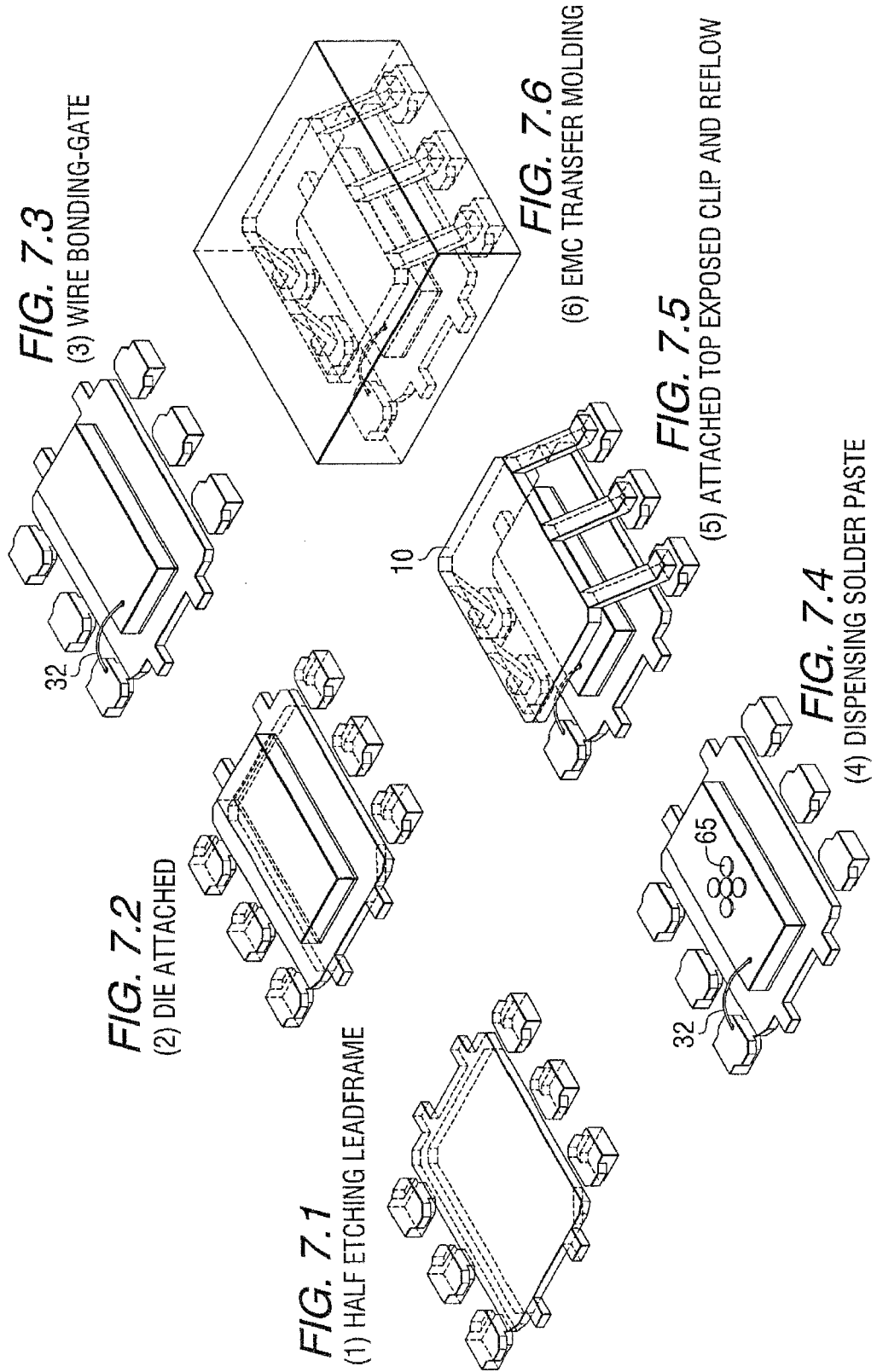

THERMAL ENHANCED UPPER AND DUAL HEAT SINK EXPOSED MOLDED LEADLESS PACKAGE

CROSS-REFERENCE TO RELATED APPLICATIONS

This application claims priority to and is a continuation of U.S. Patent Application Ser. No. 11/299,270, filed Dec. 9, 2005, now U.S. Pat. No. 7,468,548, which is hereby incorporated by reference in its entirety.

BACKGROUND

Semiconductor devices must be packaged before they can be installed and used in electronic products or systems such as cell phones, portable computers, personal digital assistants and others. The semiconductor package must accommodate the size and operation of the device that its holds and consider several factors that impact the viability and longevity of the packaged device. These factors include the cost of the package and its mechanical and electrical characteristics.

One of the most efficient methods for packaging a device is assembling the device on a lead frame and encapsulating the assembly in an insulating material such as plastic resin. That method is widely used to package most commercial semiconductor devices and other methods, such as ceramic packaging, are used for special applications such as military and outer space applications. Most plastic encapsulation is carried out by using a transfer molding process. It permits a manufacturer to simultaneously encapsulate hundreds of devices. In a typical molding process a number of semiconductor dies are attached to die attach pads of a lead frame. The lead frame may hold four to six or more dies between opposite side rails. Tie bars extend from the side rails to the die attach pad. Leads surround the die attach pad. The leads have a bond region for receiving a wire bond. After the device is placed on the die attach pad, a wire bond machine connects very small diameter gold or aluminum wires between contact pads on the device and the leads. Portions of the leads extend outside the package. Some packages have prominent leads that extend into through holes in a printed circuit board. Other packages have smaller exposed leads and some packages are termed "leadless" because they merely expose the lower surface of a lead that has its upper surface wire bonded to the device.

Packaging is the last step in semiconductor device manufacturing. After the semiconductor die is packaged, it is ready for final test, shipment and use in a product. The package must accommodate the operational parameters of the device. Every device carries electrical current and thus every device generates heat. As more and more transistors are combined on a die or as power semiconductor devices are operated at higher voltages, higher currents and higher switching speeds, more heat is generated. There is no need for such heat and too much can destroy a device.

While plastic is an inexpensive and easy to use material, it is not a good conductor of heat. Many plastic encapsulated semiconductor devices require added cooling to remove excess heat, cool the device and keep the device from failing. One way of removing excess heat is the use of external heat sinks. These are simple thermal conductors affixed to the outside of a plastic package for carrying heat away from the package.

External heat sinks are simple to install but they are often insufficient to remove heat from the package because heat generated by the device must travel by conduction through the plastic encapsulating material. The low thermal conductivity of plastic may cause excess heat to accumulate in the package before the external heat sink can remove it from the device.

Others have attempted to solve this problem by proposing a heat sink molded into the plastic package. See for example U.S. Pat. No. 6,646,339. Its FIGS. 2B and 3 are representative of a typical internal heat sink. A half etched lead frame 170 has a heat sink pedestal 180 with half etched sections 150. Heat is transferred via thermal conduction from the bottom of the die 20 to the pedestal 110 where it is dissipated in the ambient environment of the device 13. One drawback of such an arrangement is that heat generated near the surface of the die 20 and travels through the thickness of the die before reaching the heat sink pedestal 110. However, the location of the heat sink at the bottom increases the assembly cost and there is not too much heat dissipated from the top of the package.

One solution to the problem or removing heat from the top surface of a die is proposed in U.S. Pat. No. 6,844,622. See its FIGS. 5, 6 and 7. That patent describes heat sinks 53, 63, and 73 that are located above the upper surface of a semiconductor die. All those heat sinks have an exposed external surface and an internal surface member that contacts or is in thermal conduction with the top surface of the die.

The solution provided in that patent has several drawbacks. The heat sink floats and is not anchored to the lead frame. Such a floating, uncontrolled heat sink may contact the bond wires and cause a short or open circuit or both. Indeed, even placing the heat sink into the mold risks damage to the delicate and fragile bond wires. If the height of the bond wires is not precisely controlled, one or more may contact the heat sink. Since the heat sink is typically metal, such contact with a bond wire will likely short out the device. The top of the exposed heat sink is the same size as the package. That type of structure is undesired because it leaves a continuous, unprotected external lateral interface between the molding compound the metal heat sink. Since the metal and the molding compound have different thermal coefficients of expansion, the heat sink surface with delaminate from the molding compound.

SUMMARY

The invention solves the problem of heat accumulation by providing an improved upper molded heat sink. It enhances heat transfer and dissipation by proving two exposed heat sinks, one on each side of the semiconductor device. The invention also solves the problem of interference with bond wires by providing support arms that hold the upper heat sink in place and prevent it from contacting the bond wires. The support arms also restrain the upper heat sink during molding so that it does not move from its desired placement with respect to the die and the lead frame. The invention solves the delaminating problem by providing an upper heat sink that is enclosed on its sides by the molding compound and has a continuous external lateral interface between the heat sink and the molding compound. An advantage of the invention is that it is compatible with existing lead frame designs. The support arms connect to disposable tie bar members so no modification of lead frame design is required to accommodate the support arms.

In its broader aspects the invention provides a packaged semiconductor device with an upper molded heat sink and a method of making such packaged semiconductor devices. The package includes a semiconductor device having top and bottom surfaces. The die is attached to the top surface of the die attach pad of a lead frame. The die and the lead frame are connected to a molded upper heat sink. It has a planar annular base with a protruding central surface that extends from the planar annular base toward the die. One side of the protruding central surface contacts the die pad and the other side is exposed to the ambient environment to dissipate heat from the top surface of the die. The molding compound surrounds the outer edge of the planar surface to inhibit or prevent delaminating. Support arms extend from the edge of the planar annular base and are adhesively connected to tie bars on the lead frame. The tie bars are integral with the lead frame and thus stabilize the upper heat sink during molding. The tie bars are severed after molding to separate one packaged device from adjacent molded devices.

The invention provides not only a molded upper heat sink, but is also provides a molded lower heat sink. The invention has a half etched lead frame with a die pad that has another, lower heat sink.

The method of the invention begins with a step of providing a lead frame having input and output lead pads and a central die attach pad for receiving and holding a semiconductor die. An adhesive is applied to the die attach pad and the semiconductor die is placed on the pad and is held in place by the adhesive. Next the device is wire bonded to the input and output lead pads of the lead frame. The wires may be gold or aluminum or an alloy of one or both. Next an adhesive is applied to portions of the lead frame and to the top of the die. Then an upper heat sink is attached to the top of the die and to the lead frame. The upper heat sink has a planar annular portion, a protruding central portion, and four support arms. The support arms attach to tie bars of the lead frame and the protruding central portion attaches to the top of the die. Those five points of attachment are sufficient to keep the upper heat sink in place during molding. The support arm and the protruding central portion are sized to keep the planar annular ring from interfering with the bond wires. The device is commonly fabricated together with a number of other devices on lead frames held together by side rails or other disposable support members. As many as a hundred or more devices mounted on lead frames are placed into that a mold of a transfer molding machine. That machine injects molten plastic molding resin into the mold. After the resin solidifies, the mold is opened and the devices are separated from each other by a saw or other suitable singulating apparatus.

DESCRIPTION OF THE DRAWING

FIG. 2*a* is a plan exterior view of the upper heat sink assembled on a lead frame.

FIG. 2*b* is sectional view of the assembled upper heat sink taken along the line 2*b*-2*b*' of FIG. 2*a*.

FIG. 2*c* is partial perspective view of the interior surface of the upper heat sink assembled on a lead frame from which the die has been removed for purposes of illustration.

FIG. 2*d* is a sectional view take view of the assembled upper heat sink taken along the line of 2*d*-2*d*' of FIG. 2*a*.

FIGS. 5.1-5.9 show a series of steps for packaging a semiconductor device.

FIG. 6 shows an alternate series of steps for attaching the support arms to the sacrificial tie bars.

FIG. 7 shows a series of steps for attaching the support arms of the heat sink to lead embedded lead pads.

DETAILED DESCRIPTION

Figures 1A, 1B:
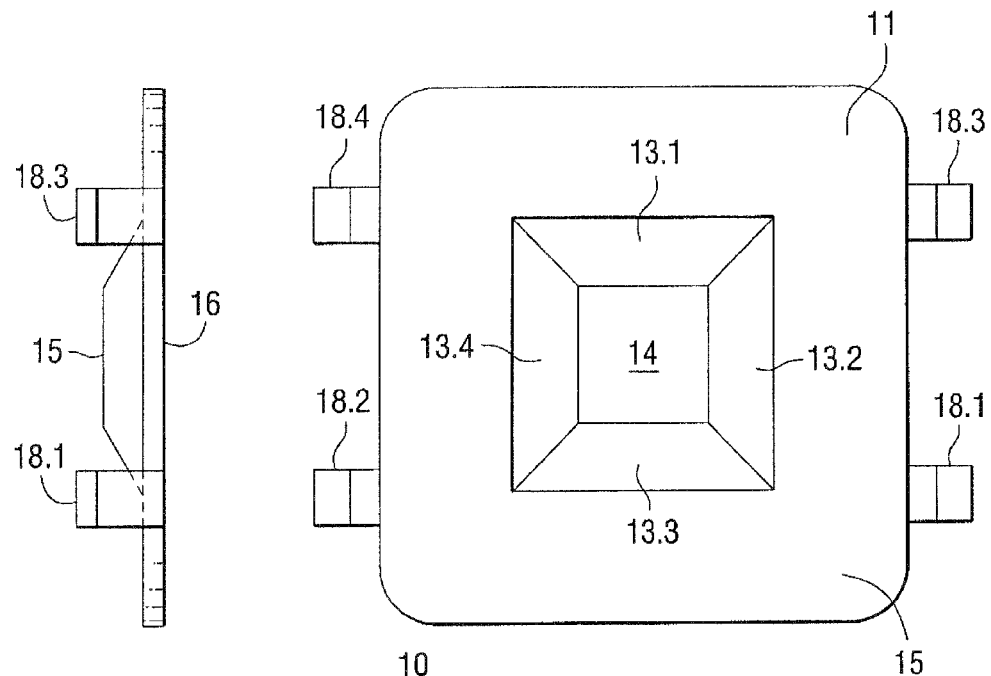
FIG. 1*a* is an exterior plan view of the upper heat sink.
FIG. 1*b* is a side view of the upper heat sink.
Figure 1C:
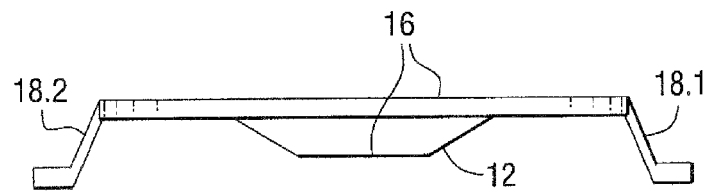
FIG. 1*c* is a sectional view of the upper heat sink.
Figure 1D:
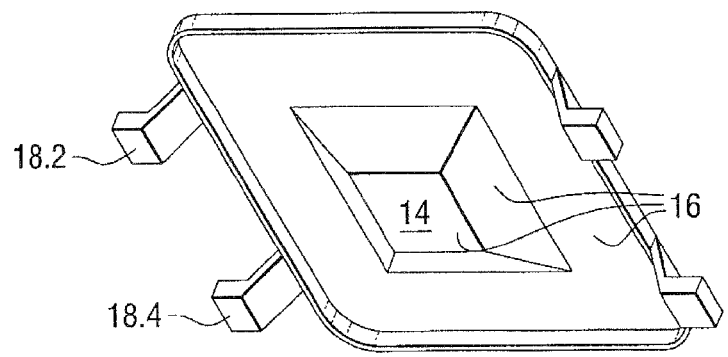
FIG. 1*d* is a perspective view of the upper heat sink showing the interior surface.

The upper heat sink 10 is constructed as shown in FIGS. 1*a*-1*d*. The upper heat sink has an interior surface 16 that faces a semiconductor device and an exterior surface 15 that is at least partially exposed to the ambient environment of the packaged device. An annular planar base 11 surrounds a raised or protruding central region 12. That region is supported above the plane of the base 11 by four sloped walls 13.1-13.4. The walls slope at an acute angle with respect to the planar annular base and incline toward the center of the upper heat sink 10. Around the outer perimeter of the annular base 11 are four support arms 18.1-18.4. The support arms are disposed at an obtuse angle with respect to the interior surface 16 of the planar annular base 11.

The upper heat sink is made of thermally conductive material. Any suitable metal, metal alloy or other material may suffice so long as the material is capable of forming the structure for the invention and has sufficient thermal conductivity to remove excess heat from the semiconductor die. In one embodiment the material is copper or copper alloy and the thickness in a range of 0.2 to 1.0 mm and preferably is 0.8 mm. The material is malleable and is formed into the desired structure by one or more metal working machines, including and not limited to punch presses and stamping machines. In a typical formation operation a rectangular sheet of metal is cut to form the support arms and the planar base. A stamping machine presses the planar base into a die cavity to form the raised or protruding center region 12 and the sloped walls 13.1-13.4. Another machine bends the support arms to the desired angle.

Figure 3:
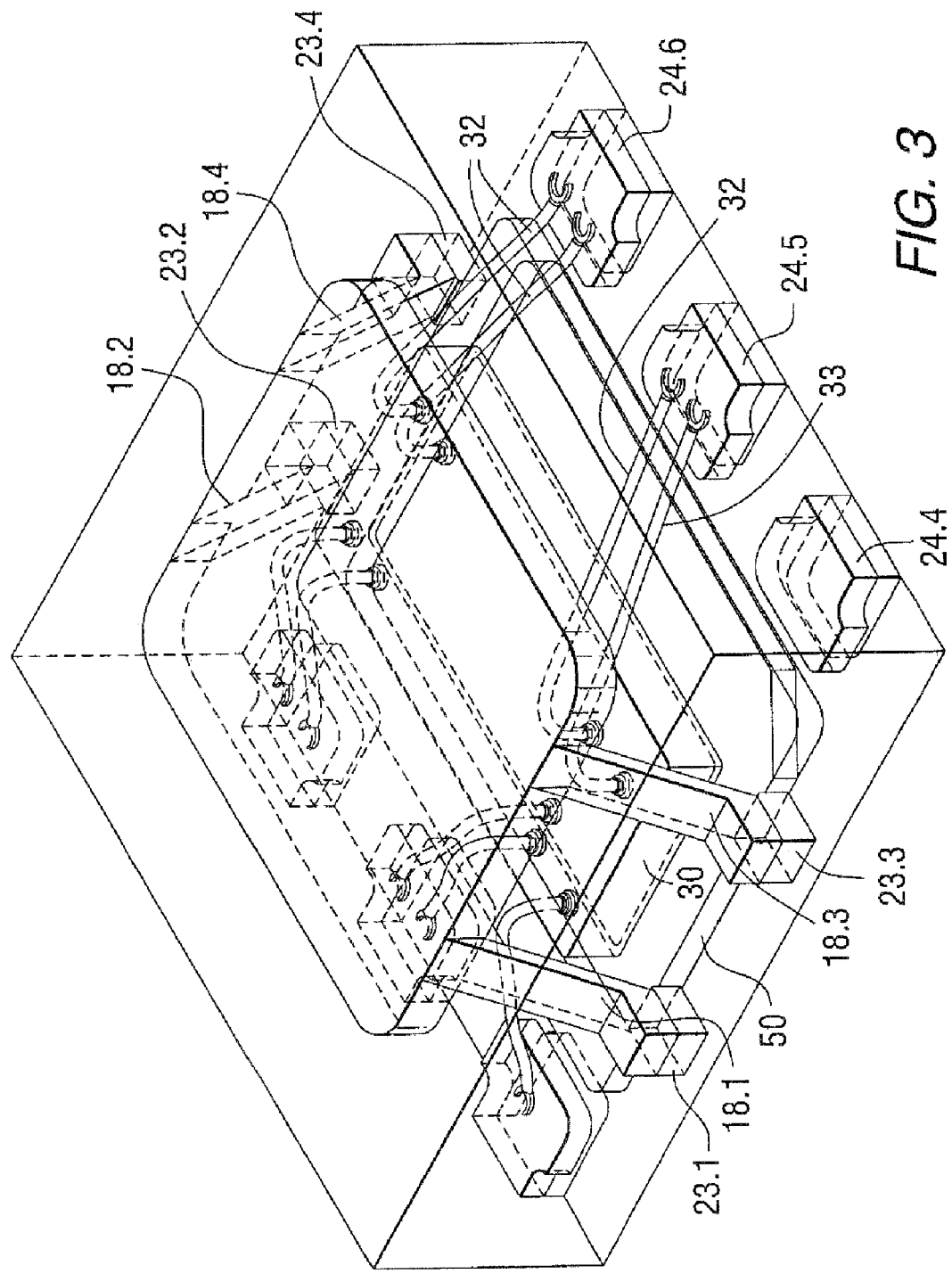
FIG. 3 is a partial perspective view showing the arms of the upper heat sink attached to tie bars of the lead frame from which the planar annular base and the protruding central surface of the upper heat sink are removed for purposes of illustration.

The upper heat sink is assembled onto a lead frame 20 and semiconductor device 30 as shown in FIGS. 2*a*-2*d*. The lead frame has opposite side rails 21, 22, a number of input and output lead pads 24.1-24.8 along edges parallel to the side rails 21, 22 and tie bars 23.1-23.4. The tie bars are on the other two edges of the lead frame and connect any one lead frame to adjacent lead frames. Those skilled in the art understand that multiple lead frames are held together with side rails and tie bars and such lead frame assemblies commonly have four to six die pads for receiving semiconductor devices or integrated circuits. The lead frames are temporarily held together by the tie bars located between die attach pads. After molding is completed, the individual packaged devices are separated from each other by severing the tie bars. The lead frame 20 may be a half etched lead frame that provides a lower heat sink 50 as an integral part of a die attach pad 31 as shown in FIGS. 2 or 3.

Figure 4:
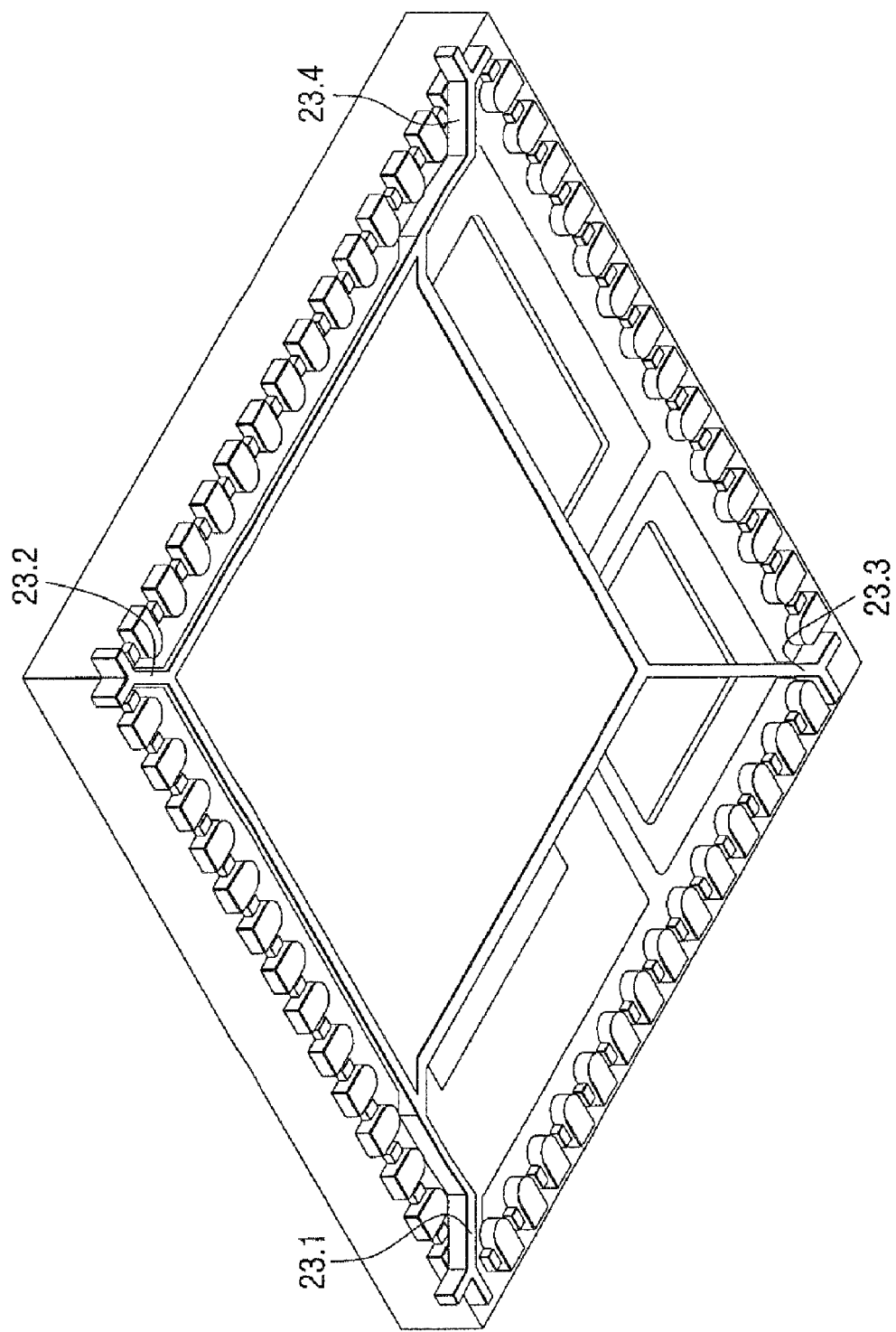
FIG. 4 shows a perspective view of a lead frame with corner tie bars.

The semiconductor device 30 is secured to the die attach pad 31 by epoxy or solder 25. The support arms 18.1-18.4 are connected respectively to the tie bars 23.1-23.4. The input/output pads 24.1-24.4 are disposed along one edge of the lead frame and the other input/output pads 24.5-25.8 are disposed along the opposite edge. Bond wires (not shown) extend between contact pads (not shown) on the periphery of the semiconductor or integrated circuit to the input/output pads of the lead frame. 20. For example, see FIG. 3 where input/output pad 24.5 is connected to the device 30 through bond wires 32 and 33. Other wire bond connections are shown but reference numbers are omitted to render the figure more understandable. That figure also shows the lower heat sink 50 and the connections of the support arms 18.1-18.4 to the respective tie bars 23.1-23.4. In larger packages, the tie bars may be located in the corners. Tie bar location is determined by the type of package (double or quad sided) and is not related to package size. See for example FIG. 4 where the tie bars are in the corners in order to provide more space around the periphery for input/output pads.

Turning now to FIGS. 5.1-5.9, they show a series of steps for packaging a semiconductor device in accordance with the invention. In FIG. 5.1 a half etched lead frame 20 is provided. It has four die attach pads and each die attach pad 31 has a pedestal lower heat sink 51. Per FIG. 5.2, a die attach adhesive 25 is applied to the die attach pads by a suitable mechanism in a manner known to those skilled in the art. The adhesive may be electrically conductive or non-conductive. A conventional die attach adhesive is Ablebond 84-1 LMISR4 supplied by Ablestik company. The lead frame passes a pick and place machine head where previously separated semiconductor device or integrated circuit devices are picked up by a vacuum head and placed onto the adhesive on the die attach pad. See FIG. 5.3. The lead frame is then cured by heat and time to set the device 30 on the die attach pad 31.

After the adhesive is cured and the die is firmly attached, the lead frame is taken through a wire bonding machine. As shown in FIG. 5.4 the machine attaches bond wires between input/output pads 24 and contact areas on the surface of the device 30. A typical bond wire 32 may be either gold or aluminum or an alloy of one or both metals. After wire bonding, another adhesive 65 is applied to the tie bars 23 and to the top of the device 30. Adhesive 65 may be the same adhesive as die attach adhesive 25 or one made especially for connecting the support arms and upper heat sink to the tie bars and device. As shown in FIG. 5.6, another pick and place machine picks up a header that has a number of upper heat sinks 10 that corresponds to the number of devices on the lead frame. The heat sinks are accurately placed over the devices and lowered into place so that the support arms 23 contact the adhesive 65 on the tie bars 18 and the interior surface of the central protruding member 14 contacts the top of the device 30. Mounting of the header does not disturb the wire bonds because the bends of the bond wire are spaced from the planar base 11 and the sloped walls 13 keep the planar base from interfering with the bond wires. The assembly 40 of the upper heat sink and lead frame are shown in FIG. 5.7. The assembly 40 is then placed with other assemblies into a mold. The mold is then injected with molten plastic resin. The plastic resin is melted and then transferred quickly under high pressure by a transfer molding machine. During injection, the upper heat sink 10 is held in place by its support arms 18.1-18.4 and by the adhesion between the face of the protruding surface 14 and the top of the die 30. The upper heat sink has four peripheral beams that tie it to the lead frame and a relatively large plate that secures it to the device. The connections are sufficient to keep the upper heat sink in place and to resist the shearing force of the hot plastic. The resin 36 hardens and thus encapsulates the assembly 40 in solid plastic. See FIG. 5.8. After the resin cures and cools, the adjacent devices are separated from each other by severing the tie bars 23 between adjacent devices. Separation is normally accomplished with a saw. See FIG. 5.9. The packaged semiconductor device has a continuous ring of molded resin around the annular planar base 11 of the upper heat sink.

As shown in FIGS. 2 and 3, the support arms are connected to the sacrificial tie bars and wire bonds the chip to the leads. Another embodiment permits the user to employ flip chip technology to attach the gate and source to the pedestal that has a suitable gate lead and connect the support arms to the tie bars. See FIGS. 6.1-6.5. Still another embodiment of the process and product makes it possible to attach the support arms to one or more of the lead frame pads. See FIGS. 7.1-7.6.

Those skilled in the art understand that the invention may be used to incorporate an upper molded heat sink into any mold-encapsulated semiconductor device. The top heat sink can be treated as a ground plane of the package and it will reduce the mutual inductance of the package and provide protection against electromagnetic interference. The top exposed heat sink can be applied to two or four sides of MLP (micro leadframe) packages. The top heat sink may have protruding portion or may be flat. The top heat sink may be used to connect the source of a high side mosfet to the drain of a low side mosfet on a multi-die paddle of a quad MLP package. An advantage of the invention is that it removes heat from the top surface of the die and that is often where most of the heat is generated. The invention may be used alone or in combination with a lower heat sink that removes heat from the lower surface of the semiconductor device. Such a dual heat sink device will have enhanced capacity to dissipate heat.

Having thus disclosed one or more embodiments of the claimed invention those skilled in the art will understand that other modifications, substitutions, changes and deletions may be made to the particular structures and processes discussed above without departing from the spirit and scope of the invention as set forth in the appended claims.

The invention claimed is:

1. A packaged semiconductor device comprising:
   a semiconductor die having top and bottom surfaces;
   a lead frame having a die pad attached to the bottom surface of the semiconductor die; and
   a metallic upper heat sink having one or more integral support members extending from the upper heat sink to the leadframe, said upper heat sink having a planar member comprising an annular ring having an inner boundary surrounding a protruding surface and a plurality of sloped wall members extending from the inner boundary of the annular ring to the protruding surface, a lower surface of said protruding surface contacting the top surface of the semiconductor die and an upper surface of said upper heat sink exposed to dissipate heat from the semiconductor die.

2. The packaged semiconductor device of claim 1 wherein the lead frame comprises a lower heat sink.

3. The packaged semiconductor device of claim 1 wherein the upper heat sink is a unitary body, the planar surface having uniform thickness.

4. The packaged semiconductor device of claim 1 further comprising a molded package housing the semiconductor die generally rectangular in shape and comprising input/output pads disposed along two opposite sides of the molded package; and further comprising support arms in the same plane as said input/output pads and on the two sides of said generally rectangular molded package not having the input/output pads.

5. The packaged semiconductor device of claim 1 wherein the lead frame is a half etched lead frame with a lower pedestal heat sink on the die pad for holding the die.

6. The packaged semiconductor device of claim 1, wherein an upper surface of said protruding surface and upper surfaces of said plurality of sloped wall members define a hollow area below the plane of said annular ring and above the protruding surface and the plurality of sloped wall members.

7. A packaged semiconductor device comprising:
   a semiconductor die having top and bottom surfaces;
   a lead frame having a die pad attached to the bottom surface of the semiconductor die;

a molded lower heat sink thermally connected to the die pad on one surface and having an exposed second surface for dissipating heat from the bottom surface of the die; and a molded upper heat sink connected to the leadframe, said upper heat sink having a planar member comprising an annular ring having an inner boundary surrounding a protruding surface and a plurality of sloped wall members extending from the inner boundary of the annular ring to the protruding surface, a lower surface of said protruding surface contacting the top surface of the semiconductor die and an upper surface of said upper heat sink exposed to dissipate heat from the semiconductor die.

8. The packaged semiconductor device of claim 7 wherein the upper heat sink is connected by one or more support members extending from the planar member to the lead frame.

9. The packaged semiconductor device of claim 7 wherein half etched lead frame has a plurality of input and output pads and the semiconductor device is electrically connected to the input and output pads by bond wires.

10. The packaged semiconductor device of claim 7 wherein the upper heat sink comprises a metal comprising copper or aluminum.

11. The packaged semiconductor device of claim 7, wherein an upper surface of said protruding surface and upper surfaces of said plurality of sloped wall members define a hollow area below the plane of said annular ring and above the protruding surface and the plurality of sloped wall members.

12. A molded resin packaged semiconductor device comprising:
    a semiconductor die having top and bottom surfaces;
    a lead frame having a die pad attached to the bottom surface of the semiconductor die; and
    a metallic upper heat sink means disposed above the semiconductor device having one or more integral support members extending from the upper heat sink to the leadframe, an annular ring having an inner boundary surrounding a protruding surface, a plurality of sloped wall members extending from the inner boundary of the annular ring to the protruding surface, a lower surface connected to the top surface of the semiconductor die, and an upper surface exposed to ambient environment for dissipating heat from the semiconductor die.

13. The molded resin packaged semiconductor device of claim 12 wherein the exposed surface of the upper heat sink means includes a concave portion.

14. The molded resin packaged semiconductor device of claim 12 wherein the upper heat sink means comprises formed sheet metal.

15. The molded resin packaged semiconductor device of claim 12 wherein mold resin surrounds the exposed surface of the upper heat sink means.

16. The packaged semiconductor device of claim 12, wherein an upper surface of said protruding surface and upper surfaces of said plurality of sloped wall members define a hollow area below the plane of said annular ring and above the protruding surface and the plurality of sloped wall members.

* * * * *